United States Patent
Owada et al.

(10) Patent No.: US 7,541,296 B2
(45) Date of Patent: Jun. 2, 2009

(54) METHOD FOR FORMING INSULATING FILM, METHOD FOR FORMING MULTILAYER STRUCTURE AND METHOD FOR MANUFACTURING SEMICONDUCTOR DEVICE

(75) Inventors: Tamotsu Owada, Kawasaki (JP); Hirofumi Watatani, Kawasaki (JP); Yoshihiro Nakata, Kawasaki (JP); Shirou Ozaki, Kawasaki (JP); Shun-ichi Fukuyama, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 612 days.

(21) Appl. No.: 11/171,318

(22) Filed: Jul. 1, 2005

(65) Prior Publication Data

US 2006/0178017 A1 Aug. 10, 2006

(30) Foreign Application Priority Data

Feb. 9, 2005 (JP) ............................. 2005-032446

(51) Int. Cl.
*H01L 21/469* (2006.01)
*H01L 21/31* (2006.01)

(52) U.S. Cl. .............................. 438/778; 257/E21.271; 257/E21.576; 438/783

(58) Field of Classification Search .......... 257/E21.271, 257/E21.576; 438/778, 783
See application file for complete search history.

(56) References Cited

U.S. PATENT DOCUMENTS

| 6,670,285 | B2 * | 12/2003 | Hawker et al. ............... 438/780 |
| 7,129,164 | B2 * | 10/2006 | Chang et al. ................. 438/637 |
| 2003/0118845 | A1 * | 6/2003 | Beekmann et al. ........... 428/446 |
| 2003/0232495 | A1 * | 12/2003 | Moghadam et al. .......... 438/623 |

FOREIGN PATENT DOCUMENTS

| JP | 2001-520459 A | 10/2001 |
| JP | 2004-538637 A | 12/2004 |
| WO | WO 99/199904 A1 | 4/1999 |
| WO | WO 03/015150 A1 | 2/2003 |

OTHER PUBLICATIONS

Patent Abstracts of Japan, Publication No. 2004-088047, published on Mar. 18, 2004.
Patent Abstracts of Japan, Publication No. 2001-291720, published on Oct. 19, 2001.
Partial Translation of Japanese Office Action dated Jun. 10, 2008, issued in corresponding Japanese Application No. 2005-032446.

* cited by examiner

*Primary Examiner*—Asok K Sarkar
(74) *Attorney, Agent, or Firm*—Fujitsu Patent Center

(57) ABSTRACT

Disclosed is a method for effectively forming a Low-k insulating film. The method comprises the steps of: spin-coating on an underlying layer a precursor solution formed by dispersing Low-k materials in a solvent to form a coating film, subjecting the coating film to a baking treatment under heating for about several minutes at a temperature near a boiling point of the solvent, forming, on the coating film after the baking treatment, an SiC barrier film using a CVD method, and subjecting the coating film to a hydrogen plasma treatment through the barrier film continuously using the same CVD apparatus as used in forming the barrier film without taking out the coating film from the CVD apparatus.

17 Claims, 6 Drawing Sheets

METHOD FOR FORMING INSULATING FILM, METHOD FOR FORMING MULTILAYER STRUCTURE AND METHOD FOR MANUFACTURING SEMICONDUCTOR DEVICE

CROSS-REFERENCE TO RELATED APPLICATIONS

This application is based upon and claims the benefits of priority from the prior Japanese Patent Application No. 2005-032446, filed on Feb. 9, 2005, the entire contents of which are incorporated herein by reference.

BACKGROUND OF THE INVENTION

1. Field of the Invention

The present invention relates to a method for forming an insulating film, a method for forming a multilayer structure and a method for manufacturing a semiconductor device. More particularly, the present invention relates to a method for forming an insulating film using low dielectric constant insulating materials (Low-k materials), a method for forming a multilayer structure using the insulating film, and a method for manufacturing a semiconductor device having the multilayer structure.

2. Description of the Related Art

In a multilayer wiring structure widely used currently in constructing a semiconductor device, a propagation speed of signals is determined mainly by a wiring resistance and a parasitic capacitance of an insulating film which is present between wirings. When a wiring interval is equal to or more than 1 μm, a capacitance between adjoining wirings is small and has a small effect on a speed of the whole device. On the other hand, when the wiring interval is about equal to or less than 0.5 μm, the capacitance between adjoining wirings has a larger effect thereon. In particular, according to the future assumption, a circuit may be formed at a wiring interval of equal to or less than 0.2 μm. In such a case, it is expected that the capacitance between adjoining wirings has an extremely large effect on the device speed. Further, a high integration in the semiconductor device proceeds in recent years and therefore, the wiring interval is made narrower. As a result, the capacitance between adjoining wirings increases if the wiring thickness is the same as heretofore. Accordingly, when reducing the wiring thickness to decrease a region of an insulating film between wirings, the capacitance between adjoining wirings can be reduced.

However, when reducing the wiring thickness, the wiring resistance increases and as a result, speeding up of a circuit operation is prevented. Accordingly, it is nowadays considered that the most effective method for attaining reduction in the capacitance between adjoining wirings is to allow a lower dielectric constant of an insulating film used. From that point of view, low-k materials having a dielectric constant of about 2.0 to 2.5 are taken notice of.

For one method for forming the insulating film (Low-k insulating film) using the Low-k materials, a so-called spin-on process is used. The spin-on process is a process as described below. A precursor solution formed by dispersing Low-k materials in a solvent is coated on a predetermined substrate by a spin coating method to form a coating film. The coating film is heated at a temperature near a boiling point of the solvent to remove the solvent (a baking process). Then, the coating film is further heated at a higher temperature for a given length of time. As a result, the coating film is sintered to form a network structure where molecules within the Low-k materials are cross-linked (a curing process). Thus, a Low-k insulating film is formed.

When forming the multilayer wiring structure using the spin-on process, the following method is used in many cases. The method comprises, for example, the steps of: forming a lower copper (Cu) wiring as a conductive material by a damascene method, forming thereon a diffusion barrier film for preventing copper diffusion by a CVD (Chemical Vapor Deposition) method, forming a Low-k insulating film as an interlayer insulating film by the spin-on process, forming an etching stopper film (a middle stopper film) or a cap film using the CVD method again, and forming within the Low-k insulating film a via which communicates with the lower copper wiring, or an upper copper wiring. At present, the diffusion barrier film as well as the interlayer insulating film is required to have a lower dielectric constant. Therefore, the diffusion barrier film is now formed using silicon nitride (SiN) or silicon carbide (SiC), particularly, SiC having a small oxygen content.

However, when forming the Low-k insulating film on the diffusion barrier film formed using such materials, there arises a problem of adhesion between the diffusion barrier film and the Low-k insulating film. In order to cope with the problem, the present inventors have made a study and found the following fact. When exposing the Low-k insulating film to hydrogen plasma after the step of forming the Low-k insulating film and before the step of forming the etching stopper film, the adhesion between the diffusion barrier film and the Low-k insulating film can be improved.

Further, in the multilayer wiring structure, minute wirings are generally used for the lower layer in many cases. In such a case, the above-described problem of the capacitance between adjoining wirings becomes more significant and therefore, it is strongly desired that the Low-k materials are used particularly for such a portion. On the other hand, in the portion where the minute wirings are used, the capacitance between adjoining wirings in the upper and lower layers also becomes important due to expansion of an electric field. Accordingly, the necessity of providing the Low-k insulating film not only between lateral wirings but also between vertical wirings increases at present.

In addition, as an example of using plasma as described above in the formation of the multilayer wiring structure, the following method is heretofore proposed. The method comprises the steps of subjecting a surface of the copper wiring formed by the damascene method to a cleanup treatment with ammonia plasma and depositing thereon SiN while keeping a vacuum condition (see, Japanese Unexamined Patent Publication No. 2001-291720). Further, this proposal discloses that the adhesion between a copper wiring and a silicon oxide film which is present between the copper wirings is improved by thus treating the surface of the copper wiring with ammonia plasma.

However, in the spin-on process for forming the Low-k insulating film, a heat treatment such as a baking treatment or a curing treatment is required as described above. In particular, the curing treatment occupies a considerable amount of the time necessary for the heat treatment.

The curing treatment is usually performed at a temperature of about 400° C. in an inactive atmosphere. In the curing treatment, the following disadvantages are normally found. Depending on the treating time during the curing treatment, a mechanical physical property of the Low-k insulating film is affected, or adhesion between the Low-k insulating film and the underlying film where the Low-k insulating film is formed or the etching stopper film formed on the insulating film is reduced. The curing treatment is performed using a method of treating wafers in a single-wafer type using a hot plate or a method of collectively treating a plurality of wafers (e.g., 25 sheets) using a furnace. Among these methods, the method of treating wafers in a single-wafer type using a hot plate is disadvantageous in that a long period of time is required for treatment of a plurality of wafers. In that respect, the method of collectively treating wafers using a furnace is more advantageous.

However, also in the method of collectively treating wafers using a furnace, the heat treatment at about 400° C. for about 60 minutes is required. In addition, accompanying the heat treatment, it becomes necessary to carry wafers in the furnace, to carry wafers from the furnace to the outside, to displace atmosphere within the furnace and to lower or raise the temperature within the furnace. As a result, the curing treatment requires about from 90 to 120 minutes in total or may require much more time in some cases.

Further, the method of collectively treating wafers using a furnace has a problem that a temperature distribution within the furnace is normally nonuniform. Therefore, heat is nonuniformly applied between wafers or within a wafer surface particularly when the wafers increase in number or in size. As a result, it becomes difficult to form the Low-k insulating film uniformly.

In addition, when a large-sized furnace capable of collectively treating a plurality of wafers for the spin-on process is introduced in preparation for increase in size of wafers, massive plant investment is made, and therefore, it is not preferred. Further, even when introducing the large-sized furnace, there still remain the above-described problems that a long period of time is required for the curing treatment or the temperature distribution within a furnace is nonuniform.

Accordingly, when the spin-on process is performed without introducing new facilities and the time required to perform the process can be shortened, the process cost can be largely reduced. Further, the time required for the whole process including the subsequent step of forming the etching stopper film to form the multilayer wiring structure can be of course shortened, so that the cost of the whole process can also be reduced. Further, when the uniform Low-k insulating film can be formed irrespective of the number or size of wafers, the multilayer wiring structure having high quality and high performance, and the semiconductor device having the multilayer wiring structure can be effectively formed at low cost.

SUMMARY OF THE INVENTION

In view of the foregoing, it is an object of the present invention to provide a method for forming an insulating film, where a uniform insulating film can be effectively formed.

It is another object of the present invention to provide a method for forming a multilayer structure using the insulating film thus formed.

It is yet another object of the present invention to provide a method for manufacturing a semiconductor device having the multilayer structure thus formed.

To accomplish the above object, according to the present invention, there is provided a method for forming an insulating film. This method for forming an insulating film comprises the steps of: coating a solution containing an insulating material to form a coating film containing the insulating material; heating the coating film to remove a solvent therefrom; and irradiating hydrogen plasma onto the coating film after removal of the solvent.

To accomplish another object, according to the present invention, there is provided a method for forming a multilayer structure using the insulating film. This method for forming a multilayer structure comprises the steps of: coating a solution containing an insulating material to form a coating film containing the insulating material; heating the coating film to remove a solvent therefrom; and irradiating hydrogen plasma onto the coating film after removal of the solvent to form the insulating film.

To accomplish yet another object, according to the present invention, there is provided a method for manufacturing a semiconductor device having the multilayer structure using the insulating film. This method for manufacturing a semiconductor device comprises the steps of: coating a solution containing an insulating material to form a coating film containing the insulating material; heating the coating film to remove a solvent therefrom; and irradiating hydrogen plasma onto the coating film after removal of the solvent to form the insulating film.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
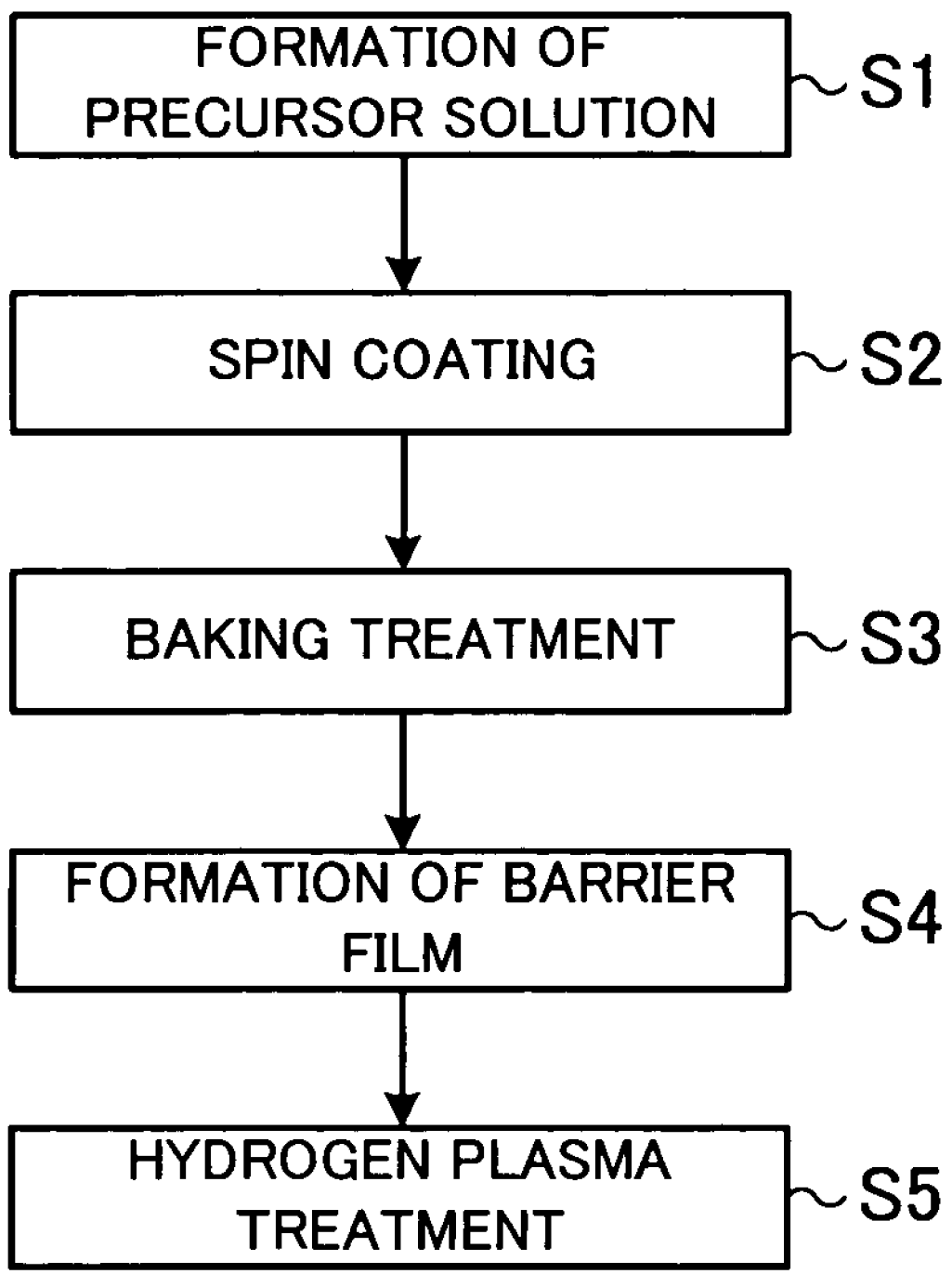
FIG. 1 shows one example of a flow chart for forming a Low-k insulating film using a spin-on process.

Preferred embodiments of the present invention will be described below with reference to the accompanying drawings, wherein like reference numerals refer to like elements throughout.

FIG. 1 shows one example of a flow chart for forming a Low-k insulating film using a spin-on process.

The formation of the Low-k insulating film using the spin-on process is performed as follows. First, Low-k materials are dispersed in a solvent to form a precursor solution (step S1). Examples of the Low-k materials which can be used include an organic polyarylene or polyallyl ether, an inorganic hydrogen sillsquioxane (HSQ), an organic and inorganic hybrid methylsillsquioxane (MSQ), or a mixed material of HSQ and MSQ.

Next, the precursor solution is coated by a spin coating method on an underlying substrate or underlying layer on which the Low-k insulating film is formed (step S2). A thickness of the Low-k insulating film formed can be controlled by a viscosity or amount of the precursor solution which drops on the underlying layer, or by a rotational velocity of the underlying layer.

Next, a coating film formed by the spin coating method is subjected to a baking treatment (step S3). In the baking treatment, the coating film is heated for about several minutes at a temperature near a boiling point of the solvent in the precursor solution and thereby removing the solvent from the coating film.

Next, on the coating film after the baking treatment, a suitable film such as SiC, silicon oxide ($SiO_2$), SiN, silicon-oxy-carbide (SiOC) or tetraethoxysilane is formed to an appropriate film thickness by a CVD method to thereby form a barrier film (step S4). For example, the SiC film can be formed by the CVD method using only tetramethylsilane gas, or using tetramethylsilane gas and an oxidizing agent gas such as carbon dioxide as raw materials. Further, the SiC film can also be formed by the CVD method using only dimethylphenylsilane, or using dimethylphenylsilane and an oxidizing agent gas as raw materials. In addition, the SiOC film can be formed by the CVD method using tetramethyl-cyclo-tetrasiloxane and an oxidizing agent gas.

Finally, the coating film after the baking treatment is irradiated with hydrogen plasma through the barrier film using the same CVD apparatus as used in forming the barrier film without taking out the film from the device (step S5). For example, a treating object after the formation of the barrier film is heated as it is to about 400° C. within the same CVD apparatus as used in forming the barrier film, or is carried to a treatment region heated to 400° C. Then, the treating object is irradiated with a predetermined amount of hydrogen plasma from the barrier film side only for a predetermined time.

When thus performing the treatment of irradiating hydrogen plasma (hydrogen plasma treatment), molecules within Low-k materials are cross-linked to form a network structure and thereby forming the Low-k insulating film. Further, in the hydrogen plasma treatment, the structure can be formed in a very dense state by irradiating hydrogen plasma for an extremely short period of time, for example, for several tens of seconds. An object of the conventional curing treatment using a furnace also is to form the structure. In other words, when performing the hydrogen plasma treatment, the curing treatment can be effectively performed. Accordingly, a dose of the hydrogen plasma in the step S5 may be set, for example, to the total amount of the hydrogen plasma necessary for the curing treatment of the coating film after the baking treatment.

In addition, it is preferred that the hydrogen plasma treatment is performed as described above. That is, the barrier film is formed after the baking treatment and then, the hydrogen plasma treatment is performed through the barrier film.

Figure 2:
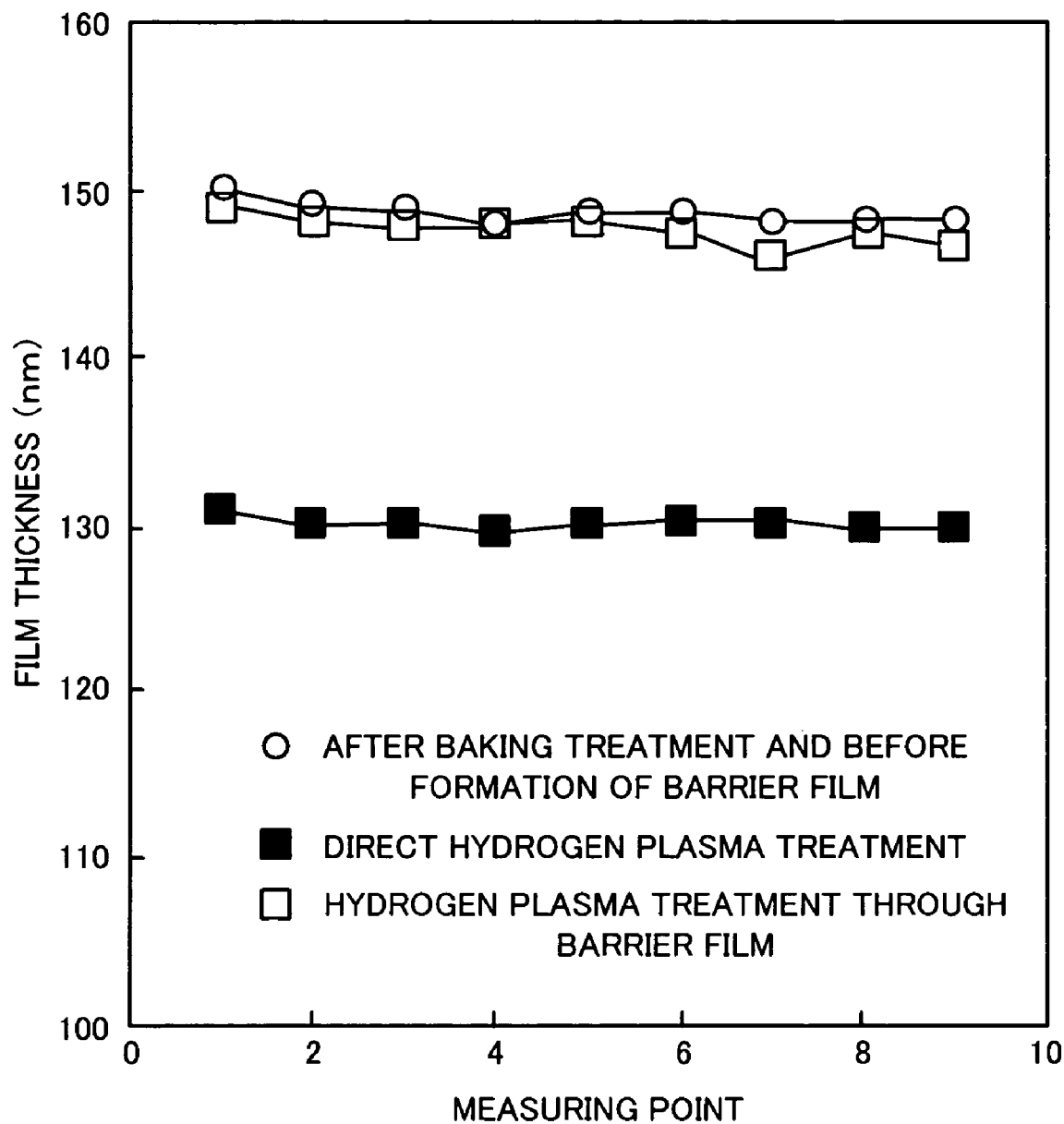
FIG. 2 shows an effect of a hydrogen plasma treatment on a film thickness of a Low-k insulating film.

Herein, FIG. 2 shows an effect of the hydrogen plasma treatment on a film thickness of the Low-k insulating film. In FIG. 2, the horizontal axis shows a measuring point of the film thickness of the Low-k insulating film, and the vertical axis shows the film thickness (nm) of the Low-k insulating film.

FIG. 2 shows measurement results of the film thickness of the Low-k insulating film in each measuring point. In the measurement, the following samples are used: a sample after the baking treatment and before the formation of the barrier film, a sample formed by directly performing the hydrogen plasma treatment after the baking treatment, and a sample formed by forming a barrier film after the baking treatment and then performing the hydrogen plasma treatment through the barrier film. The measuring points are set to corresponding positions among the respective samples.

From FIG. 2, the following facts are found. The sample formed by directly performing the hydrogen plasma treatment after the baking treatment is remarkably reduced in the film thickness in any measuring point, as compared with the sample formed by performing the hydrogen plasma treatment through the barrier film. To the contrary, when performing the hydrogen plasma treatment through the barrier film, the film thickness in each of the measuring points is scarcely reduced from the initial state after the baking treatment and before the formation of the barrier film, even after the hydrogen plasma treatment.

Figure 3:
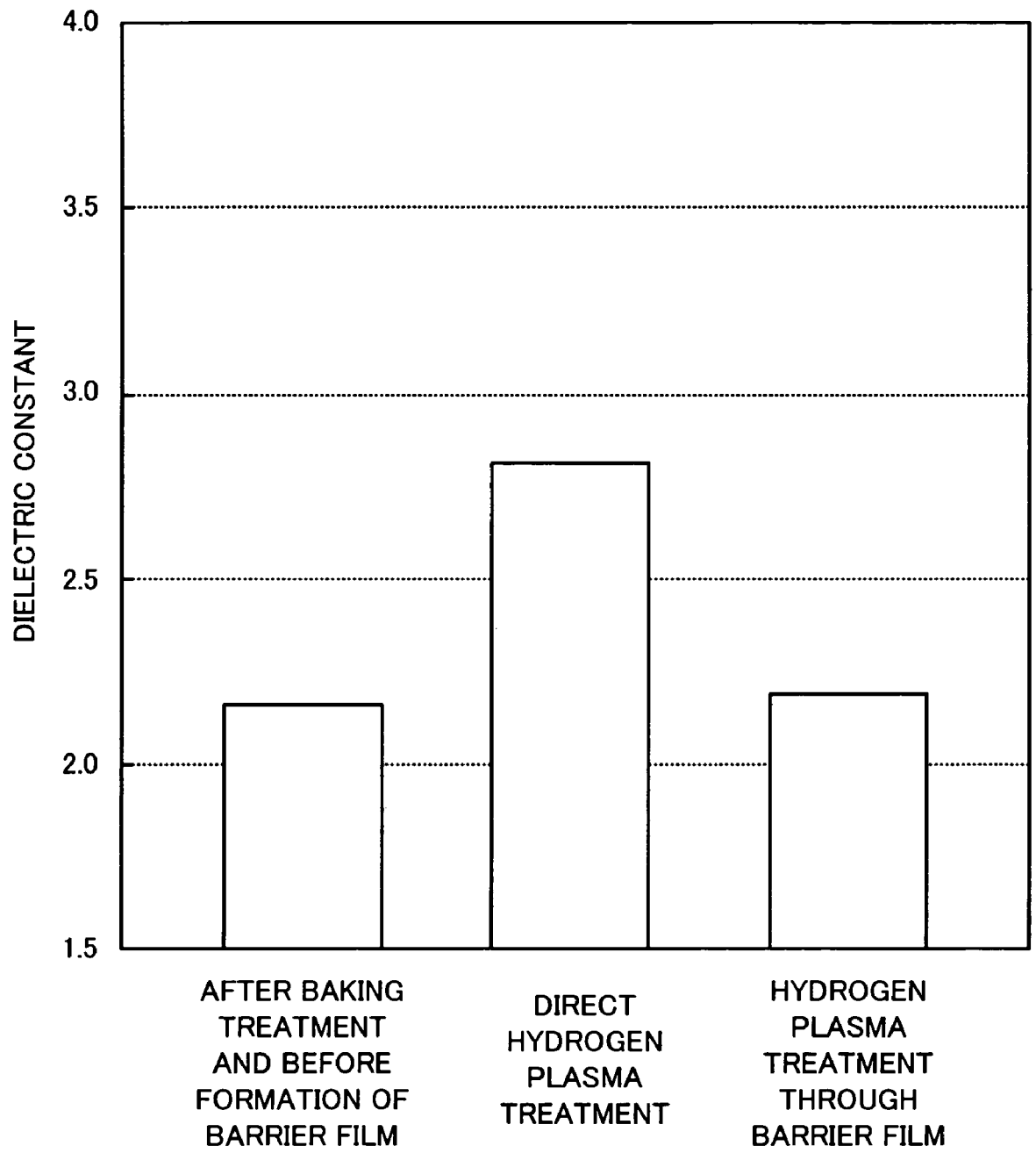
FIG. 3 shows an effect of a hydrogen plasma treatment on a dielectric constant of a Low-k insulating film.

FIG. 3 shows an effect of the hydrogen plasma treatment on a dielectric constant of the Low-k insulating film. FIG. 3 shows measurement results of the dielectric constant of each sample described in the FIG. 2.

From FIG. 3, the following facts are found. The sample formed by directly performing the hydrogen plasma treatment after the baking treatment is increased in the dielectric constant, as compared with the initial state after the baking treatment and before the formation of the barrier film as well as the sample formed by performing the hydrogen plasma treatment through the barrier film. When performing the hydrogen plasma treatment through the barrier film, increase in the dielectric constant is suppressed even after the hydrogen plasma treatment.

As shown in FIGS. 2 and 3, when performing the hydrogen plasma treatment through the barrier film, decrease in the film thickness of the formed Low-k insulating film as well as increase in the dielectric constant thereof can be suppressed.

As described above, in the method for forming the Low-k insulating film, the hydrogen plasma treatment is performed for a short period of time after the baking treatment of the spin-coated Low-k material, so that the curing treatment equal to or more than the conventional curing treatment using a furnace can be performed. When performing the hydrogen plasma treatment, the barrier film is formed on a surface of the coating film after the baking treatment and then the hydrogen plasma treatment is performed through the barrier film, so that the Low-k insulating film having a desired film thickness and a dielectric constant can be formed. Further, in this forming method, the formation of the barrier film and the hydrogen plasma treatment can be performed using the same CVD apparatus. Therefore, the curing treatment time is largely shortened so that the Low-k insulating film can be effectively formed.

Further, in the method for forming the Low-k insulating film, it should be noted that when applying this forming method to formation of the multilayer wiring structure, the barrier film for use in the hydrogen plasma treatment can be used as an etching stopper film (a middle stopper film) or a cap film within the multilayer wiring structure. More specifically, the formation process of the Low-k insulating film is allowed to serve as a so-called multitasking process capable of simultaneously performing the curing treatment and the formation of a laminated film such as an etching stopper film laminated on the insulating film. Accordingly, in this case, a material or film thickness of the barrier film may be set according to the function or intended use of the laminated film.

As described above, in the method for forming the Low-k insulating film, the curing treatment can be incorporated into the downstream CVD process. Therefore, the time required for the curing treatment which may be repeatedly performed in the formation process of the multilayer wiring structure is largely shortened so that the multilayer wiring structure can be more effectively formed. As a result, the process cost or the product cost can be reduced. Further, existing facilities can be used for a spin coater or the CVD apparatus. Therefore, a new plant investment is not required, and even when a wafer having a large diameter is used, introduction of a large-sized furnace corresponding to a size of the wafer is not required.

In the foregoing explanation, a method is described in which one layer barrier film is formed after the baking treatment of the coating film containing the Low-k material and then a total amount of the hydrogen plasma necessary for the curing treatment is irradiated collectively (steps S3 to S5). However, the irradiation of hydrogen plasma may be performed in numbers. For example, the following method may also be used. The formation of a thin barrier film and the irradiation of hydrogen plasma are alternately repeated after the baking treatment to finally form the barrier film having a desired film thickness as well as to complete the curing treatment and thereby forming the Low-k insulating film. In the method, the film thickness of each of the barrier films to be formed at one time and the dose of hydrogen plasma may be each set according to the number of repetitions thereof. Also by using the method, the same effects as those shown in the FIGS. 2 and 3 can be obtained. When providing a hydrogen plasma irradiation head within the CVD apparatus that performs formation of the barrier film, an atmosphere causing no contamination of impurities in vacuum can be kept, so that a desired barrier film can be obtained.

Further, in the foregoing explanation, the following method may also be used. The Low-k insulating film is formed to have a porous structure containing voids and thereby further reducing the dielectric constant. In this case, when forming the precursor solution in the step S1, a template material, for example, a desorbing agent having a boiling point slightly higher than that of a solvent is incorporated into the solution. Next, in the same manner as in the steps S2 and S3, the resulting solution is coated on the underlying layer to form the coating film and then the film is subjected to the baking treatment. In the baking treatment, the coating film is heated at a temperature near the boiling point of the template material, and thereby removing the template material from the coating film. Subsequently, the formation of the barrier film and the hydrogen plasma treatment may be performed according to the steps S4 and S5. Alternatively, the Low-k material previously having a molecular cluster structure may be used. In this case, a coating film having voids is formed after the baking treatment. Subsequently, the formation of the barrier film and the hydrogen plasma treatment may be performed according to the steps S4 and S5. Also in these cases, the formation of the barrier film and the hydrogen plasma treatment may be of course performed alternately as described above.

A case where the above-described method for forming the Low-k insulating film is applied to formation of the multilayer structure is described below with reference to specific examples.

First, a first application example is described.

Figure 4:
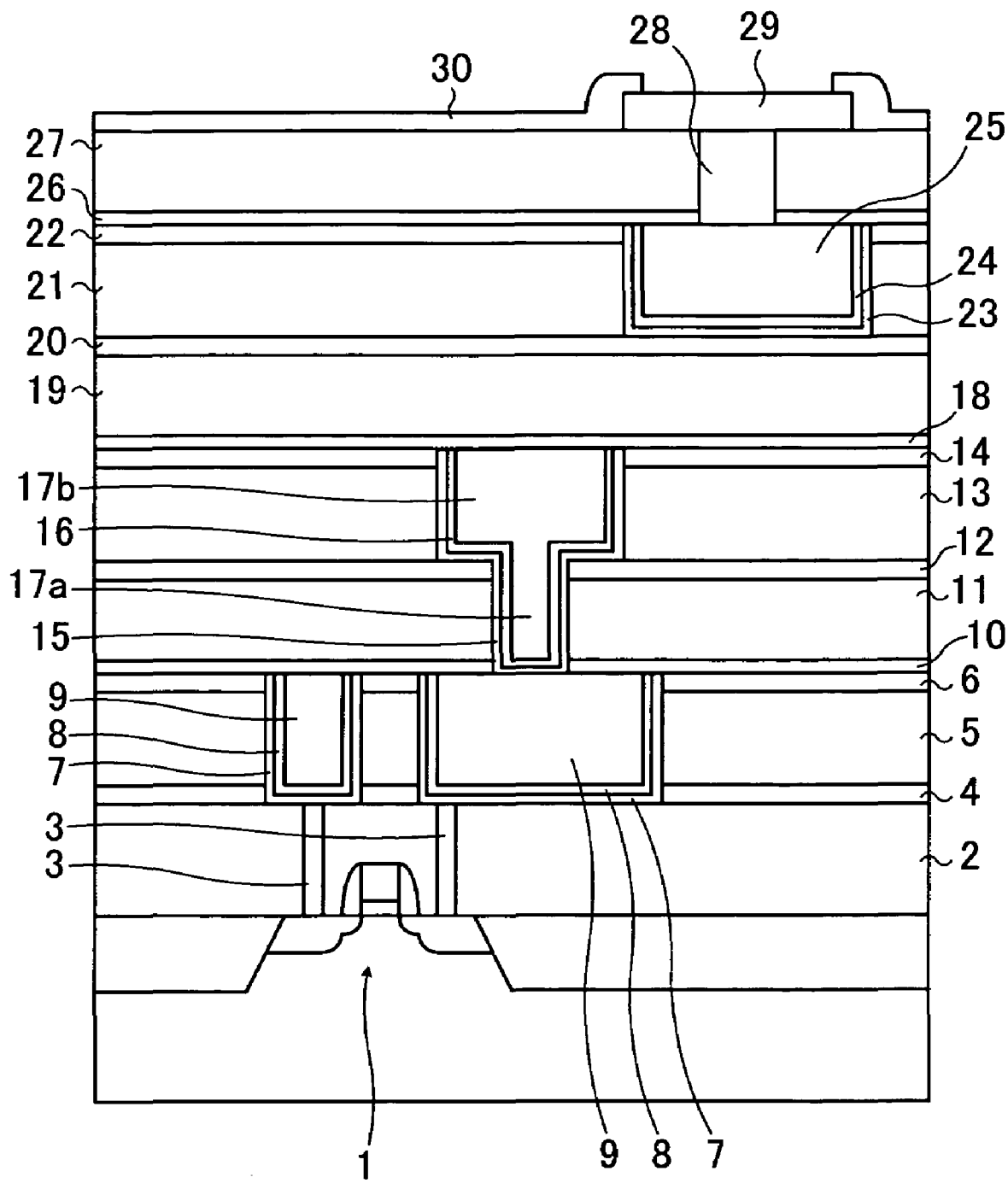
FIG. 4 is a schematic sectional view showing an essential part of a multilayer wiring structure according to a first application example.

FIG. 4 is a schematic sectional view showing an essential part of a multilayer wiring structure according to the first application example.

After formation of an element 1, a PSG (Phospho-Silicate Glass) film 2 is formed to a film thickness of about 1.5 µm (substrate temperature: about 600° C.) by the CVD method and is planarized by a CMP (Chemical Mechanical Polishing) method. Next, a via groove is formed in the film by a conventional method using as a mask a resist pattern for extracting an electrode. Then, tungsten is buried in the via and unnecessary tungsten is removed by the CMP method. Thus, a tungsten plug 3 connected to the element 1 is formed.

Next, a SiC film (ESL 3: trade name, produced by Novellus Systems, Inc.) is formed by the CVD method to form a SiC etching stopper film 4 having a film thickness of about 30 nm.

The SiC etching stopper film 4 is formed under the following conditions. That is, the flow rate of tetramethylsilane gas as a raw material is about 500 sccm, the pressure within a chamber is about 1.8 Torr, the high frequency radio frequency electric power is about 600 W, and the low frequency radio frequency electric power is about 300 W.

Next, using the Low-k material (NCS: trade name, produced by Catalysts & Chemicals Industries Co., Ltd.) comprised of a mixed material of MSQ and HSQ, a hybrid porous silica film 5 as the Low-k insulating film is formed to a film thickness of about 130 nm by the spin-on process. At this time, NCS is spin-coated on the SiC etching stopper film 4 to form the film 5. Then, the film 5 is just heated for about 3 minutes at a temperature of about 350° C. for the sake of the baking treatment for removing the solvent.

Next, the SiC film (ESL 2: trade name, produced by Novellus Systems, Inc.) is formed by the CVD method to form a SiC cap film 6. At the same time, the curing treatment of the porous silica film 5 by hydrogen plasma irradiation is performed within the same CVD apparatus. More specifically, the following operation is performed. First, a first SiC film having a film thickness of about 5 nm is formed and then a first hydrogen plasma treatment is performed. Further, a second SiC film having a film thickness of about 5 nm is formed and then a second hydrogen plasma treatment is performed. This operation is repeatedly performed to finally form the SiC cap film 6 having a film thickness of about 30 nm. During each film formation, the hydrogen plasma treatment is intermittently performed five times. Formation of each SiC film is performed under the following conditions. That is, the flow rate of tetramethylsilane gas as the raw material is about 1000 sccm, the pressure within a chamber is about 2.3 Torr, the high frequency radio frequency electric power is about 600 W and the low frequency radio frequency electric power is about 300 W. Each SiC film is allowed to function as a barrier film which prevents the porous silica film 5 from being directly irradiated with the hydrogen plasma. Further, the hydrogen plasma treatment is performed by irradiating hydrogen plasma five times for about 90 seconds in total under the following conditions. That is, the flow rate of hydrogen gas is about 4000 sccm, the pressure within a chamber is about 2.3 Torr and the high frequency radio frequency electric power is about 250 W (single frequency).

Next, an antireflection film (not shown) is provided. Using as a mask a resist pattern for forming wirings, the SiC cap film 6, the porous silica film 5 and the SiC etching stopper film 4 are partially removed by the conventional method to form a wiring groove. Next, using a sputtering method, a tantalum nitride (TaN) film 7 and a Cu film 8 are each formed in the wiring groove to a film thickness of about 30 nm, and copper is buried therein by a plating method. Further, unnecessary copper is removed by the CMP method to form a copper wiring 9. Then, for a diffusion barrier film for preventing copper diffusion, an UDC-SiC (undoped carbide SiC) film having a small oxygen content is formed to a film thickness of about 50 nm by the CVD method and thereby forming an UDC-SiC diffusion barrier film 10. The UDC-SiC diffusion barrier film 10 is formed under the following conditions. That is, the flow rate of tetramethylsilane gas as a raw material is about 650 sccm, the pressure within a chamber is about 4.5 Torr, the high frequency radio frequency electric power is about 500 W, and the low frequency radio frequency electric power is about 150 W.

Through the steps so far, a first wiring layer with an objective multilayer wiring structure is formed.

Next, on the UDC-SiC diffusion barrier film 10, a hybrid porous silica film 11 is formed to a film thickness of about 250 nm by the spin-on process using NCS in the same manner as in the first wiring layer. Also in this case, NCS is spin-coated on the UDC-SiC diffusion barrier film 10 to form the film 11. Then, the film 11 is just heated for about 3 minutes at a temperature of about 350° C. for the sake of the baking treatment.

Next, the SiC film (ESL 2: trade name) is formed by the CVD method to form a SiC middle stopper film 12. At the same time, the curing treatment of the porous silica film 11 by hydrogen plasma irradiation is performed within the same CVD apparatus. Herein, in the same manner as in the first wiring layer, each SiC film is formed by about 5 nm and the hydrogen plasma treatment is performed five times during each film formation. Thus, the SiC middle stopper film 12 having a film thickness of about 30 nm is finally formed. At this time, the film formation conditions of the SiC middle stopper film 12 and the hydrogen plasma irradiation conditions of the hydrogen plasma treatment are set to the same conditions as those in the formation of the SiC cap film 6 previously formed.

Next, on the SiC middle stopper film 12, a hybrid porous silica film 13 is formed to a film thickness of about 170 nm by the spin-on process using NCS in the same manner as in the first wiring layer. Also in this case, NCS is spin-coated on the SiC middle stopper film 12 to form the film 13. Then, the film 13 is just heated for about 3 minutes at a temperature of about 350° C. for the sake of the baking treatment.

Next, the SiC film (ESL 2: trade name) is formed by the CVD method to form a SiC cap film 14. At the same time, the curing treatment of the porous silica film 13 by hydrogen plasma irradiation is performed within the same CVD apparatus. Also herein, in the same manner as in the first wiring layer, each SiC film is formed by about 5 nm and the hydrogen plasma treatment is performed five times during each film formation. Thus, the SiC cap film 14 having a film thickness of about 30 nm is finally formed. At this time, the film formation conditions of the SiC cap film 14 and the hydrogen plasma irradiation conditions of the hydrogen plasma treatment are set to the same conditions as those in the formation of the SiC cap film 6 previously formed.

Next, an antireflection film (not shown) is provided. Using as a mask a resist pattern for forming vias, a via groove that communicates with the copper wiring 9 is first formed by the conventional method. Next, using as a mask a resist pattern for forming wirings, a wiring groove is formed similarly by the conventional method in which a hole is opened until the SiC middle stopper film 12 is exposed. Next, using the sputtering method, a TaN film 15 and a Cu film 16 are each formed in the via groove and the wiring groove to a film thickness of about 30 nm, and copper is buried therein by the plating method. Further, unnecessary copper is removed by the CMP method to form a via 17a and a copper wiring 17b. Then, for a diffusion barrier film for preventing copper diffusion, an UDC-SiC diffusion barrier film 18 is formed to a film thickness of about 50 nm by the CVD method. At this time, the forming conditions thereof are set to the same conditions as those in the formation of the UDC-SiC diffusion barrier film 10 previously formed.

Through the steps so far, a second wiring layer having an objective multilayer wiring structure is formed.

In the same manner as in the formation of the second wiring layer, a third wiring layer is formed as follows. First, a porous silica film 19, a SiC middle stopper film 20, a porous silica film 21 and a SiC cap film 22 are sequentially formed on the film 18. Next, a wiring groove is formed and then, a TaN film 23 and a Cu film 24 are formed in the groove. Next, copper is buried therein to form a copper wiring 25. On the surface, a SiC etching stopper film 26 and a $SiO_2$ interlayer insulating film 27 are formed. Next, a via that communicates with the copper wiring 25 is formed and then, a tungsten plug 28 is formed in the via. Next, an aluminum pad 29 is formed on the plug 28. Finally, a protective film 30 is formed on an area other than a part of the aluminum pad 29 surface.

In the thus formed multilayer wiring structure according to the first application example, the following effects can be found. In a reliability acceleration test using a heat cycle, occurrence of deterioration is prevented and a preferred result is obtained, as compared with the multilayer wiring structure formed by a method where the film formation is performed using NCS and the conventional curing treatment is performed using a furnace.

Next, a second application example is described.

Figure 5:
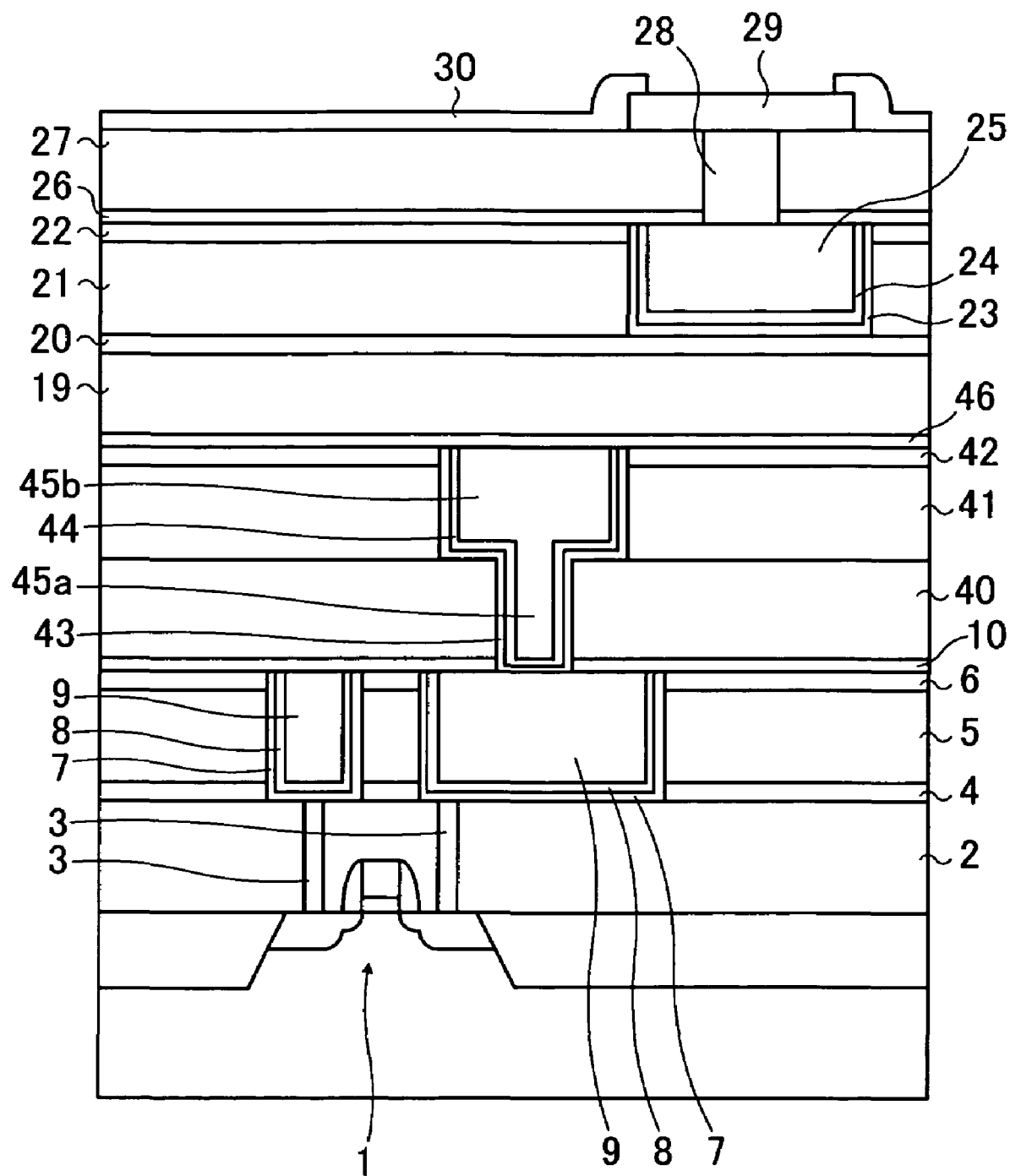
FIG. 5 is a schematic sectional view showing an essential part of a multilayer wiring structure according to a second application example.

FIG. 5 is a schematic sectional view showing an essential part of the multilayer wiring structure according to the second application example.

In the second application example, after the formation of the first wiring layer having the multilayer wiring structure described in the first application example, the second and third wiring layers are sequentially formed according to the following steps. In the description of the second application example, the same elements as those described in the first application example are indicated by the same reference numerals as in the first application example and the description is omitted.

After formation of the UDC-SiC diffusion barrier film 10 in the first wiring layer, a plasma treatment is first performed within the same CVD apparatus while introducing carbon dioxide, whereby a surface of the UDC-SiC diffusion barrier film 10 is oxidized. At this time, carbon dioxide plasma irradiation is performed under the following conditions. That is, the flow rate of carbon dioxide is about 500 sccm, the pressure within a chamber is about 3.5 Torr, the high frequency radio frequency electric power is about 100 W and the treating time is about 5 seconds.

Next, a silicon-oxy-carbide film 40 is formed to a film thickness of about 170 nm while introducing tetramethyl-cyclo-tetrasiloxane and carbon dioxide into the chamber. The silicon-oxy-carbide film 40 is formed under the following conditions. That is, the flow rate of tetramethyl-cyclo-tetrasiloxane is about 1 sccm, the flow rate of carbon dioxide is about 5000 sccm, the pressure within the chamber is about 3.5 Torr, the high frequency radio frequency electric power is about 300 W and the low frequency radio frequency electric power is about 200 W.

Next, on the silicon-oxy-carbide film 40, a hybrid porous silica film 41 as the Low-k insulating film is formed to a film thickness of about 150 nm by the spin-on process using NCS in the same manner as in the first wiring layer. Also in this case, NCS is spin-coated on the silicon-oxy-carbide film 40 to form the film 41. Then, the film is just heated for about 3 minutes at a temperature of about 350° C. for the sake of the baking treatment.

Next, the SiC film (ESL 2: trade name) is formed by the CVD method to form a SiC cap film 42. At the same time, the curing treatment of the porous silica film 41 by hydrogen plasma irradiation is performed within the same CVD apparatus. Herein, in the same manner as in the first wiring layer, each SiC film is formed by about 5 nm and the hydrogen plasma treatment is performed five times during each film formation. Thus, the SiC cap film 42 having a film thickness of about 30 nm is finally formed. At this time, the film formation conditions of the SiC cap film 42 and the hydrogen plasma irradiation conditions of the hydrogen plasma treatment are set to the same conditions as those in the formation of the SiC cap film 6 previously formed.

Next, an antireflection film (not shown) is provided. Using as a mask a resist pattern for forming vias, a via groove that communicates with the copper wiring 9 is first formed by the conventional method. Next, using as a mask a resist pattern for forming wirings, a wiring groove that reaches the silicon-oxy-carbide film 40 is formed similarly by the conventional method. Next, using the sputtering method, a TaN film 43 and a Cu film 44 are each formed to a film thickness of about 30 nm, and copper is buried in the via groove and the wiring groove by the plating method. Further, unnecessary copper is removed by the CMP method to form a via 45*a* and a copper wiring 45*b*. Then, for a diffusion barrier film for preventing copper diffusion, an UDC-SiC diffusion barrier film 46 is formed to a film thickness of about 50 nm by the CVD method. At this time, the forming conditions are set to the same conditions as those in the formation of the UDC-SiC diffusion barrier film 10 previously formed.

Through the steps so far, a second wiring layer having an objective multilayer wiring structure is formed.

In the same manner as in the first application example, a subsequent third wiring layer is formed as follow. First, the porous silica film 19, the SiC middle stopper film 20, the porous silica film 21 and the SiC cap film 22 are sequentially formed on the film 46. Next, a wiring groove is formed and then, the TaN film 23 and the Cu film 24 are formed in the groove. Next, copper is buried therein to form the copper wiring 25. On the surface, the SiC etching stopper film 26 and the SiO$_2$ interlayer insulating film 27 are formed. Next, a via that communicates with the Cu wiring 25 is formed and then, the tungsten plug 28 is formed in the via. Next, the aluminum pad 29 is formed on the tungsten plug 28. Finally, the protective film 30 is formed on an area other than a part of the aluminum pad 29 surface.

In the thus formed multilayer wiring structure according to the second application example, the following effects can be found. In a reliability acceleration test using a heat cycle, occurrence of deterioration is prevented and a preferred result is obtained, as compared with the multilayer wiring structure formed by a method where the film formation is performed using NCS and the conventional curing treatment is performed using a furnace.

Next, a third application example is described.

Figure 6:
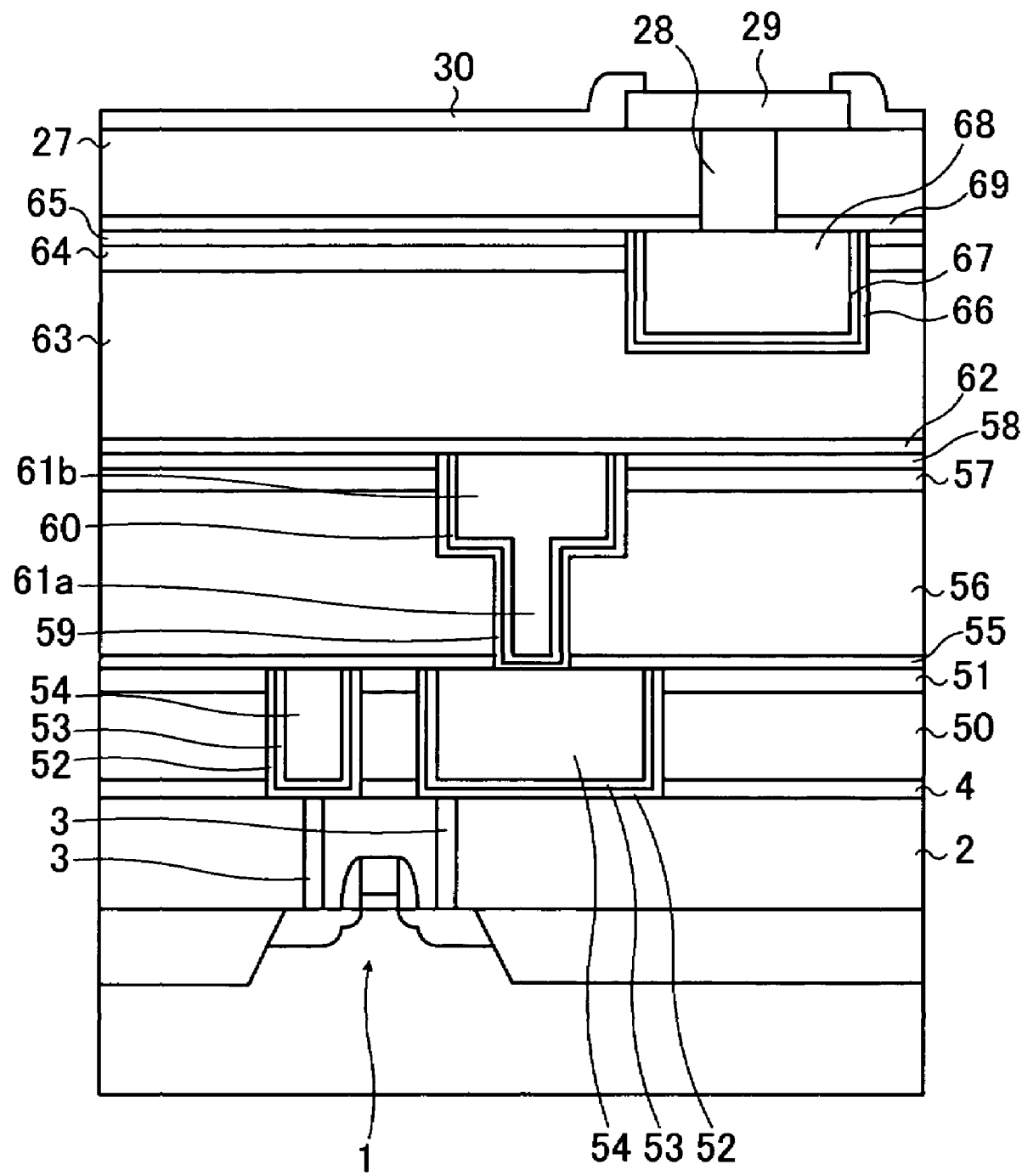
FIG. 6 is a schematic sectional view showing an essential part of a multilayer wiring structure according to a third application example.

FIG. 6 is a schematic sectional view showing an essential part of the multilayer wiring structure according to the third application example.

In the description of the third application example, the same elements as those described in the first application example are indicated by the same reference numerals as in the first application example and the description is omitted.

After formation of the element 1, the PSG (Phospho-Silicate Glass) film 2 is formed to a film thickness of about 1.5 μm (substrate temperature: about 600° C.) and is planarized by the CMP method. Next, a via groove is formed in the film and then, tungsten is buried in the via. Thus, the tungsten plug 3 connected to the element 1 is formed. Next, the SiC film (ESL 3: trade name, produced by Novellus Systems, Inc.) is formed to form the SiC etching stopper film 4 having a film thickness of about 30 nm.

Next, using the Low-k material (SiLK: trade name, produced by the Dow Chemical Company), an organic insulating film 50 as the Low-k insulating film is formed to a film thickness of about 250 nm by the spin-on process. At this time, Silk is spin-coated on the SiC etching stopper film 4 to form the organic insulating film 50. Then, the film 50 is just heated for about 5 minutes at a temperature of about 350° C. for the sake of the baking treatment for removing the solvent.

Next, a SiO film is formed by the CVD method to form a SiO cap film 51. At the same time, the curing treatment of the organic insulating film 50 by hydrogen plasma irradiation is performed within the same CVD apparatus. More specifically, the following operation is performed. After completion of heating at about 400° C. for about one minute, a first SiO film having a film thickness of about 16 nm is formed and then a first hydrogen plasma treatment is performed. Further, after completion of heating at about 400° C. for about one minute, a second SiO film having a film thickness of about 5 nm is formed and then a second hydrogen plasma treatment is performed. This operation is repeatedly performed to finally form the SiO cap film 51 having a film thickness of about 100 nm. During each film formation, the heating treatment for about 6 minutes and five hydrogen plasma treatments are intermittently performed. The hydrogen plasma treatment is performed by irradiating hydrogen plasma five times for about 90 seconds in total under the following conditions. That is, the flow rate of hydrogen gas is about 4000 sccm, the pressure within a chamber is about 2.3 Torr and the high frequency radio frequency electric power is about 250 W (single frequency).

Next, using as a mask a resist pattern for forming wirings, the SiO cap film 51, the organic insulating film 50 and the SiC etching stopper film 4 are partially removed by the conventional method to form a wiring groove. Next, using the sputtering method, a TaN film 52 and a Cu film 53 are each formed in the wiring groove to a film thickness of about 30 nm, and copper is buried therein by the plating method. Further, unnecessary copper is removed by the CMP method to form a copper wiring 54. Then, the SiC film (ESL 3: trade name) is formed to a film thickness of about 50 nm by the CVD method to form a SiC diffusion barrier film 55.

Through the steps so far, a first wiring layer with an objective multilayer wiring structure is formed.

Next, an organic insulating film 56 is formed to a film thickness of about 450 nm by the spin-on process using SiLK (trade name) in the same manner as in the first wiring layer. Then, a SiO cap film 57 is formed to a film thickness of about 100 nm by the CVD method. At this time, Silk is spin-coated on the SiC diffusion barrier film 55 to form the organic insulating film 56. Then, the film 56 is just heated for about 5 minutes at a temperature of about 350° C. for the sake of the baking treatment. Next, in the same manner as in the first wiring layer, each SiO film is formed by about 16 nm and the hydrogen plasma treatment is performed five times during each film formation. Thus, the SiO cap film 57 having a film thickness of about 100 nm is finally formed. At this time, the hydrogen plasma irradiation conditions of the hydrogen plasma treatment are set to the same conditions as those in the formation of the SiO cap film 51 previously formed.

Next, on the SiO cap film 57, a SiN film is formed to a film thickness of about 50 nm by the CVD method to form a SiN hard mask 58. Further, wiring pattern formation and via pattern formation on the SiN hard mask 58 are performed to form a via groove and a wiring groove. Subsequently, the following operation is performed in the same manner as in the formation of the copper wiring 54 in the first wiring layer. A TaN film 59 and a Cu film 60 are each formed to a film thickness of about 30 nm, and copper is buried in the via groove and the wiring groove by the plating method. Further, a via 61*a* and a copper wiring 61*b* are formed by the CMP method. Then, the SiC film (ESL 3: trade name) is formed to a film thickness of about 50 nm by the CVD method to form a SiC diffusion barrier film 62.

Through the steps so far, a second wiring layer with an objective multilayer wiring structure is formed.

In the same manner as in the formation of the second wiring layer, a subsequent third wiring layer is formed as follows. First, an organic insulating film 63, a SiO cap film 64 and a SiN hard mask 65 are sequentially formed on the film 62. Next, a wiring groove is formed and then, a TaN film 66 and a Cu film 67 are formed in the groove. Next, copper is buried therein to form a copper wiring 68. On the surface, a SiC diffusion barrier film 69 and the $SiO_2$ interlayer insulating film 27 are formed. Next, a via that communicates with the copper wiring 68 is formed and then, the tungsten plug 28 is formed in the via. Next, the aluminum pad 29 is formed on the plug 28. Finally, the protective film 30 is formed on an area other than a part of the aluminum pad 29 surface.

In the thus formed multilayer wiring structure according to the third application example, the following effects can be found. As a result of measurement, a capacitance of the second wiring layer is about 180 fF/mm. In a heat treatment at a temperature of about 400° C. for about 30 minutes, film peeling is not observed at all. In a reliability acceleration test using a heat cycle, occurrence of deterioration is prevented and a preferred result is obtained, as compared with the multilayer wiring structure formed by a method where the film formation is performed using SiLK (trade name) and the conventional curing treatment is performed using a furnace.

As described in the foregoing pages, the curing treatment of the Low-k material in the spin-on process is performed as follows. After the baking treatment of the Low-k material, the barrier film is formed. Then, hydrogen plasma is irradiated through the film using the CVD apparatus. As a result, a high-quality Low-k insulating film having a desired film thickness and dielectric constant can be effectively formed.

According to the above-described method, existing facilities can be used. Therefore, introduction of new facilities, for example, introduction of a large-sized curing treatment apparatus such as an electric furnace is not required. Further, the curing treatment is performed using hydrogen plasma. Therefore, even when forming the Low-k material on the low dielectric constant film such as SiC, the adhesion between films can be secured.

Further, when the barrier film formed on the Low-k material is an etching stopper film (a middle stopper film) or cap film having the multilayer wiring structure, the curing treatment can be incorporated into the CVD film formation step in forming such a film. Therefore, more effective formation of the Low-k insulating film can be realized. Further, the Low-k insulating film having a desired film thickness and dielectric constant can be formed. Therefore, the via depth or wiring thickness formed on the film can be suitably controlled. As a result, the semiconductor device having a highly reliable multilayer wiring structure capable of high-speed operation can be realized at low cost.

In the present invention, the insulating film is formed by the following method. A solution containing an insulating material is coated to form a coating film. The coating film is heated to remove a solvent therefrom. Then, hydrogen plasma is irradiated onto the coating film after removal of the solvent. As a result, the following advantages can be obtained. The spin-on process can be performed in a short period of time and therefore, a uniform insulating film can be effectively formed at low cost. Further, existing facilities can be used for the hydrogen plasma irradiation and therefore, introduction of new facilities is not required.

When using the method, the following advantage can be further obtained. The multilayer structure having high quality and high performance, and the semiconductor device having the multilayer structure can be effectively formed at low cost.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for forming an insulating film, comprising:
    coating a solution containing an insulating material to form a coating film containing the insulating material;
    heating the coating film to remove a solvent therefrom;
    forming a barrier film on the coating film after removal of the solvent; and
    irradiating hydrogen plasma onto the coating film through the barrier film.

2. The method according to claim 1,
    wherein the barrier film is formed on the coating film after removal of the solvent using a CVD apparatus, and
    wherein the hydrogen plasma is irradiated onto the coating film through the barrier film using the CVD apparatus.

3. The method according to claim 1, wherein forming the barrier film on the coating film after removal of the solvent and irradiating the hydrogen plasma onto the coating film through the barrier film are alternately repeated.

4. The method according to claim 3, a film thickness of each of the insulating films to be formed at one time and a dose of the hydrogen plasma are set according to the number of repetitions.

5. The method according to claim 1, wherein the solution contains a template material having a boiling point different from that of the solvent, further comprising:
    heating the coating film to remove the template material therefrom after heating the coating film to remove the solvent therefrom,
    wherein the hydrogen plasma is irradiated onto the coating film through the barrier film.

6. The method according to claim 1, wherein the insulating material has a molecular cluster structure, and wherein after heating the coating film to remove the solvent therefrom, a void is formed in the coating film.

7. A method for forming a multilayer structure using an insulating film, comprising:
    coating a solution containing an insulating material to form a coating film containing the insulating material,
    heating the coating film to remove a solvent therefrom,
    forming a barrier film on the coating film after removal of the solvent, and
    irradiating hydrogen plasma onto the coating film through the barrier film to form the insulating film.

8. The method according to claim 7, further comprising:
    forming a groove in the insulating film, and
    burying a conductive material in the groove.

9. The method according to claim 7,
    wherein the barrier film is an etching stopper film, a middle stopper film or a cap film.

10. The method according to claim 7, wherein the barrier film is formed on the coating film after removal of the solvent using a CVD apparatus, and
    wherein the hydrogen plasma is irradiated onto the coating film through the barrier film using the CVD apparatus to form the insulating film.

11. The method according to claim 7, wherein forming the barrier film on the coating film after removal of the solvent and irradiating the hydrogen plasma onto the coating film through the barrier film to form the insulating film are alternately repeated.

12. The method according to claim 11, a film thickness of each of the insulating films to be formed at one time and a dose of the hydrogen plasma are set according to the number of repetitions.

13. The method according to claim 7, wherein the solution contains a template material having a boiling point different from that of the solvent, further comprising:

heating the coating film to remove the template material therefrom after heating the coating film to remove the solvent therefrom, wherein the hydrogen plasma is irradiated onto the coating film through the barrier film to form the insulating film.

14. The method according to claim 7, wherein the insulating material has a molecular cluster structure, and wherein after heating the coating film to remove the solvent therefrom, a void is formed in the coating film.

15. The method according to claim 7, wherein the barrier film is formed using silicon carbide, silicon-oxy-carbide, silicon oxide, tetraethoxysilane or silicon nitride.

16. A method for manufacturing a semiconductor device having a multilayer structure using an insulating film, comprising:

coating a solution containing an insulating material to form a coating film containing the insulating material, heating the coating film to remove a solvent therefrom, forming a barrier film on the coating film after removal of the solvent, and irradiating hydrogen plasma onto the coating film through the barrier film to form the insulating film.

17. The method according to claim 16, further comprising:

forming a groove in the insulating film, and burying a conductive material in the groove.

* * * * *